US006727136B1

(12) United States Patent
Buller et al.

(10) Patent No.: US 6,727,136 B1
(45) Date of Patent: Apr. 27, 2004

(54) FORMATION OF ULTRA-SHALLOW DEPTH SOURCE/DRAIN EXTENSIONS FOR MOS TRANSISTORS

(75) Inventors: James F. Buller, Austin, TX (US); Derick J. Wristers, Bee Caves, TX (US); David Wu, Austin, TX (US); Akif Sultan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/273,291

(22) Filed: Oct. 18, 2002

(51) Int. Cl.[7] .................... H01L 21/336; H01L 21/8238
(52) U.S. Cl. ...................... 438/231; 438/232; 438/301; 438/305
(58) Field of Search ................... 438/231, 474, 438/232, 305, 306, 533, 303, 301

(56) References Cited

U.S. PATENT DOCUMENTS 5,710,450 A  *  1/1998  Chau et al. .................. 257/344
5,789,301 A  *  8/1998  Hill .............................. 438/319
6,326,664 B1 * 12/2001 Chau et al. .................. 257/344
6,537,886 B2 *  3/2003  Lee .............................. 438/306

* cited by examiner

Primary Examiner—John F. Niebling
Assistant Examiner—Walter L. Lindsay, Jr.

(57) ABSTRACT

A method of manufacturing a semiconductor device, comprising sequential steps of:

(a) providing a semiconductor substrate including a pre-selected thickness strained lattice layer of a first semiconductor material at an upper surface thereof and an underlying layer of a second semiconductor material; and (b) introducing a dopant-containing species of one conductivity type into at least one pre-selected portion of the strained lattice layer of first semiconductor material to form a dopant-containing region therein with a junction at a depth substantially equal to the pre-selected thickness, wherein the second semiconductor material of the underlying layer inhibits diffusion thereinto of the dopant-containing species from the strained lattice layer, thereby controlling/limiting the depth of the junction to substantially the pre-selected thickness of the strained lattice layer.

16 Claims, 1 Drawing Sheet

FORMATION OF ULTRA-SHALLOW DEPTH SOURCE/DRAIN EXTENSIONS FOR MOS TRANSISTORS

FIELD OF THE INVENTION

The present invention relates generally to the manufacture of high speed MOS semiconductor devices with improved transistor performance, and to MOS transistor devices obtained thereby. Specifically, the present invention relates to a method for fabricating MOS transistors with ultra-shallow depth source/drain extensions for providing improved device performance characteristics, which method utilizes strained lattice semiconductor substrates.

BACKGROUND OF THE INVENTION

The escalating requirements for high density and performance associated with ultra-large-scale integration (ULSI) semiconductor devices require design features of 0.18 μm and below, e.g., such as 0.15 μm and 0.12 μm, increased transistor and circuit speeds, high reliability, and increased manufacturing throughput for economic competitiveness. The reduction of design features to 0.18 μm and below challenges the limitations of conventional semiconductor materials and manufacturing techniques.

A problem associated with reduction of transistor design features to 0.18 μm and below is the difficulty in forming ultra-shallow source/drain extension regions in conventional silicon (Si)-wafer based substrate materials. Specifically, ultra-shallow depth source/drain extensions having sufficiently low series resistance, thus high doping levels, are required for obtaining high quality transistor performance characteristics, including, inter alia, $I_{off}$ vs. $I_{on}$ and saturation threshold roll-off voltage $V_{ts}$. This problem is especially severe in the manufacture of p-channel MOS transistors comprising a boron (B)-containing p-type dopant species, largely due to the ease with which the small-sized boron atoms/ions diffuse in conventional Si-based semiconductor substrates.

As a consequence of the above-described and other shortcomings and drawbacks of conventional Si-based semiconductor substrates when utilized in the manufacture of ULSI semiconductor devices with design features below about 0.18 μm, there recently has been much interest in various approaches with the aim or goal of developing new semiconductor materials which provide increased speeds of electron and hole flow therethrough, thereby permitting fabrication of semiconductor devices, such as integrated circuit (IC) devices with higher operating speeds, enhanced performance characteristics, and lower power consumption. One such material which shows promise in attaining the goal of higher device operating speeds is termed "strained silicon".

According to this approach, a very thin, tensilely strained, crystalline silicon (Si) layer (sometimes referred to as a "cap" layer) is epitaxially grown on a relaxed, graded composition Si—Ge buffer layer, which Si—Ge buffer layer in turn is formed on a suitable crystalline substrate, e.g., a Si wafer or a silicon-on-insulator (SOI) wafer. Strained Si technology is based upon the tendency of the Si atoms, when epitaxially deposited on the Si—Ge buffer layer, to align with the greater lattice constant (spacing) of the Si and Ge atoms therein (relative to pure Si). As a consequence of the Si atoms being deposited on a substrate (Si—Ge) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron mobility/current flow in strained Si may be up to about 70% higher compared to electron flow in conventional Si. Transistors and IC devices formed with such strained Si layers can exhibit operating speeds up to about 35% faster than those of equivalent devices formed with conventional Si, without necessity for reduction in transistor size.

In view of the above, there exists a need for improved methodology for fabrication of high speed, sub-micron-dimensioned MOS transistors and CMOS devices which facilitates obtainment of the transistor performance advantages accruing from low series resistance, ultra-shallow depth source/drain extension regions not obtainable with conventional Si-based substrate materials, i.e., improved $I_{off}$ vs. $I_{on}$ and $V_{ts}$, and the enhanced device speeds attributable to the use of strained lattice semiconductor substrates.

The present invention, wherein high performance MOS transistors and CMOS devices comprising low series resistance, ultra-shallow depth source/drain extension regions, are formed in strained lattice semiconductor substrates by a process wherein the source/drain extension region depth is limited by the thickness of the "cap" layer, effectively overcomes problems associated with the manufacture of MOS transistors with ultra-shallow depth source/drain extension regions in conventional Si-based semiconductor substrates. As a consequence, the inventive methodology facilitates manufacture of high speed, high performance, reduced power consumption semiconductor devices utilizing strained semiconductor technology. Further the methodology afforded by the present invention enjoys diverse utility in the manufacture of numerous and various semiconductor devices and/or components therefor which require ultra-shallow junction depths and low series resistance for optimal performance.

DISCLOSURE OF THE INVENTION

An advantage of the present invention is an improved method for manufacturing a semiconductor device.

Another advantage of the present invention is an improved method of manufacturing a MOS transistor device with ultra-shallow depth source/drain extension regions.

Still another advantage of the present invention is an improved method of manufacturing a MOS transistor comprising a strained lattice semiconductor layer.

A further advantage of the present invention is an improved semiconductor device.

A still further advantage of the present invention is an improved MOS transistor having ultra-shallow depth source/drain regions.

A yet further advantage of the present invention is an improved MOS transistor comprising a strained lattice semiconductor layer.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the invention, the foregoing and other advantages are obtained in part by a method of manufacturing a semiconductor device, comprising sequential steps of:

(a) providing a semiconductor substrate including a pre-selected thickness strained lattice layer of a first semiconductor material at an upper surface thereof and an underlying layer of a second semiconductor material; and (b) introducing a dopant-containing species of one conductivity type into at least one pre-selected portion of the strained lattice layer of first semiconductor material to form a dopant-containing region therein with a junction at a depth substantially equal to the pre-selected thickness, wherein the second semiconductor material of said underlying layer inhibits diffusion thereinto of the dopant-containing species from the strained lattice layer, thereby controlling/limiting the depth of the junction to substantially the pre-selected thickness of the strained lattice layer.

According to embodiments of the present invention, step (a) comprises providing a semiconductor substrate which further comprises a layer of a third semiconductor material beneath the layer of a second semiconductor material.

In accordance with preferred embodiments of the invention, the device comprises at least one MOS transistor, and step (a) comprises providing a MOS transistor precursor structure including a semiconductor substrate with at least one gate oxide/gate electrode layer stack on at least one portion of the upper surface of the substrate, the gate oxide/gate electrode layer stack including a pair of opposed side edges; and step (b) comprises introducing the dopant-containing species into exposed portions of the strained lattice layer to form at least one pair of shallow depth source/drain extension regions therein, each of the source/drain extension regions extending from just beneath a respective side edge of the gate oxide/gate electrode layer stack; and step (b) comprises introducing the dopant-containing species by ion implantation, with the at least one gate oxide/gate electrode layer stack serving as an implantation mask.

According to embodiments of the present invention, step (a) comprises providing a semiconductor substrate wherein the strained lattice layer has a thickness from about 25 to about 400 Å; and step (b) comprises forming ultra-shallow source/drain extension regions having a junction depth from about 25 to about 400 Å; whereas, according to certain preferred embodiments of the present invention, step (a) comprises providing a semiconductor substrate wherein the strained lattice layer has a thickness from about 50 to about 200 Å; and step (b) comprises forming ultra-shallow source/drain extension regions having a junction depth from about 50 to about 200 Å.

Embodiments of the present invention include the further step of:

(c) introducing dopant-containing species of the one conductivity type into portions of the shallow-depth source/drain extension regions to form deeper source/drain regions therein each having a junction within the third semiconductor layer; wherein step (c) includes forming sidewall spacers on each of the opposing side edges of the gate oxide/gate electrode layer stack and introducing the dopant-containing species in the portions of the source/drain extension regions by ion implantation, with the gate oxide/gate electrode layer stack with the sidewall spacers thereon serving as an implantation mask.

According to particular embodiments of the present invention, step (a) comprises providing a MOS transistor structure including a substrate wherein the strained lattice semiconductor layer of a first semiconductor material is a crystalline, epitaxial silicon (Si) layer from about 25 to about 400 Å thick, the underlying layer of a second semiconductor material is a crystalline, graded composition silicon-germanium (Si—Ge) layer from about 100 to about 300 Å thick, the crystalline, epitaxial Si layer being formed on the Si—Ge layer, and the layer of a third semiconductor material beneath the Si—Ge layer is a crystalline Si layer of a monocrystalline Si or silicon-on-insulator (SOI) material; and step (b) comprises forming at least one pair of shallow depth source/drain extension regions having a junction depth from about 25 to about 400 Å, whereas, according to certain preferred embodiments of the present invention, step (a) comprises providing a MOS transistor structure including a substrate wherein the strained lattice semiconductor layer of a first semiconductor material is a crystalline, epitaxial silicon (Si) layer from about 50 to about 200 Å thick; and step (b) comprises forming at least one pair of shallow depth source/drain extension regions having a junction depth from about 50 to about 200 Å.

In accordance with further preferred embodiments of the present invention, step (b) comprises implanting boron (B)-containing p-type dopant species at a dosage from about $1 \times 10^{14}$ to about $5 \times 10^{15}$ da/cm$^2$ and an energy from about 100 eV to about 3 KeV, the at least one gate oxide/gate electrode layer stack serving as an implantation mask; and the method comprises further step (c) of forming sidewall spacers on each of the opposing side edges of the at least one gate oxide/gate electrode layer stack and implanting the boron (B)-containing p-type dopant species in exposed portions of the shallow-depth source/drain extension regions at a dosage from about $1 \times 10^{15}$ to about $1 \times 10^{16}$ da/cm$^2$ and an energy from about 400 eV to about 5 KeV to form deeper source/drain regions each having a junction within the layer of third semiconductor material, the at least one gate oxide/gate electrode layer stack with the sidewall spacers thereon serving as an implantation mask.

Another aspect of the present invention is a method of manufacturing a MOS transistor device, comprising steps of:

(a) providing a semiconductor substrate including a pre-selected thickness strained lattice layer of a first semiconductor material at an upper surface thereof, an underlying layer of a second semiconductor material, and a layer of a third semiconductor material beneath the layer of a second semiconductor material;

(b) forming at least one gate oxide/gate electrode layer stack on at least one portion of the upper surface of said substrate, the gate oxide/gate electrode layer stack including a pair of opposed side edges;

(c) introducing a dopant-containing species into exposed portions of the strained lattice layer to form at least one pair of ultra-shallow depth source/drain regions therein, each of the source/drain extension regions extending from just beneath a respective side edge of the at least one gate oxide/gate electrode layer stack and having a junction at a pre-selected depth substantially equal to the pre-selected thickness of the strained lattice layer, wherein the second semiconductor material of the underlying layer inhibits diffusion thereinto of the dopant-containing species from the strained lattice layer, thereby controlling/limiting the depth of the junction to substantially the pre-selected thickness of the strained lattice layer, and (d) introducing the dopant-containing species in exposed portions of the shallow-depth source/drain extension regions to form deeper source/drain regions each having a junction within the layer of third semiconductor material.

According to certain preferred embodiments of the present invention, step (a) comprises providing a substrate wherein the strained lattice semiconductor layer of a first semiconductor material is a crystalline, epitaxial silicon (Si) layer of pre-selected thickness from about 25 to about 400 Å, the underlying layer of a second semiconductor material is a crystalline, graded composition silicon-germanium (Si—Ge) layer from about 100 to about 300 Å thick, the crystalline, epitaxial Si layer being formed on the Si—Ge layer, and the layer of a third semiconductor material beneath the Si—Ge layer is a crystalline Si layer of a monocrystalline Si or silicon-on-insulator (SOI) material; step (c) comprises forming ultra-shallow source/drain extension regions having a junction depth from about 25 to about 400 Å; and step (d) comprises forming deeper source/drain regions having a junction depth from about 150 to about 1,000 Å.

In accordance with certain preferred embodiments of the present invention, step (c) comprises forming ultra-shallow source/drain extension regions having a junction depth from about 50 to about 200 Å; and step (d) comprises forming deeper source/drain regions having a junction depth from about 200 to about 1,000 Å; wherein: step (c) comprises implanting boron (B)-containing p-type dopant species at a dosage from about $1 \times 10^{14}$ to about $5 \times 10^{15}$ da/cm$^2$ and an energy from about 100 eV to about 3 KeV, the at least one gate oxide/gate electrode layer stack serving as an implantation mask; and step (d) comprises forming sidewall spacers on each of the opposing side edges of the gate oxide/gate electrode layer stack and implanting the boron (B)-containing p-type dopant species in exposed portions of the shallow-depth source/drain extension regions at a dosage from about $1 \times 10^{15}$ to about $1 \times 10^{16}$ da/cm$^2$ and an energy from about 400 eV to about 5 KeV to form deeper source/drain regions each having a junction within the layer of third semiconductor material, the at least one gate oxide/gate electrode layer stack with the sidewall spacers thereon serving as an implantation mask.

Still another aspect of the present invention is a semiconductor device, comprising:

(a) a semiconductor substrate including a pre-selected thickness strained lattice layer of a first semiconductor material at an upper surface thereof, an underlying layer of a second semiconductor material, and a layer of a third semiconductor material beneath the layer of a second semiconductor material; and (b) at least one dopant-containing region in at least one portion of the strained lattice layer, having a junction in the substrate at a depth substantially equal to the pre-selected thickness of the strained lattice layer, wherein the second semiconductor material of the underlying layer inhibits diffusion thereinto of the dopant-containing species from the strained lattice layer, thereby controlling/limiting the depth of the junction to substantially the pre-selected thickness of the strained lattice layer.

According to certain preferred embodiments of the present invention, the semiconductor substrate (a) comprises a crystalline, epitaxial silicon (Si) strained lattice semiconductor layer of pre-selected thickness from about 25 to about 400 Å, the underlying layer of a second semiconductor material is a crystalline, graded composition silicon-germanium (Si—Ge) layer from about 100 to about 300 Å thick, the crystalline, epitaxial Si layer being formed on the Si—Ge layer, and the layer of a third semiconductor material beneath the Si—Ge layer is a crystalline Si layer of a monocrystalline Si or silicon-on-insulator (SOI) material; the dopant-containing species is a boron (B)containing p-type dopant, and the at least one dopant-containing region in the at least one portion of the strained lattice layer is at least one pair of ultra-shallow-depth source/drain extension regions of a p-channel MOS transistor, wherein the junction depth of the at least one pair of ultra-shallow-depth source/drain extension regions is from about 50 to about 200 Å; and the MOS transistor further comprises: (c) at least one pair of deeper source/drain regions each with a junction within the layer of a third semiconductor material.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention is based upon the discovery that formation of high quality, high speed semiconductor devices, e.g., MOS devices such as P- and N-channel MOS transistors, and CMOS devices, suitable for use in the manufacture of semiconductor integrated circuit (IC) devices, can be readily fabricated with accurately controlled, ultra-shallow depth source/drain extension regions having low series resistance, by means of a process which utilizes strained lattice semiconductor materials for obtaining precise control of the depth of the source/drain extension regions, as well as significantly enhanced electron and hole mobility. As a consequence of the inventive methodology, fabrication is facilitated of high speed, sub-micron-dimensioned MOS transistors and CMOS devices with performance advantages accruing from the presence of low series resistance, ultra-shallow depth source/drain extension regions not obtainable with conventional Si-based substrate materials, i.e., improved $I_{off}$ vs. $I_{on}$ and $V_{ts}$, and the enhanced device speeds attributable to the use of strained lattice semiconductor substrates.

A key feature of the present invention, i.e., accurate depth control of the source/drain extension regions, is achieved by pre-selection of appropriate thickness of the strained lattice ("cap") layer, the material of the underlying buffer layer, and the dopant species, such that the thickness of the former layer effectively determines (i.e., limits) the depth of the source/drain extension region junction, and the material of the latter layer effectively inhibits diffusion thereinto of the dopant species from the former layer. In addition, the use of a dopant diffusion-inhibiting material for the buffer layer enables use of increased dopant implant dosages for the source/drain extension regions, resulting in lowered series resistance thereof, in turn providing improved $I_{off}$ vs. $I_{on}$ and $V_{ts}$, of the transistors.

Figure 1:
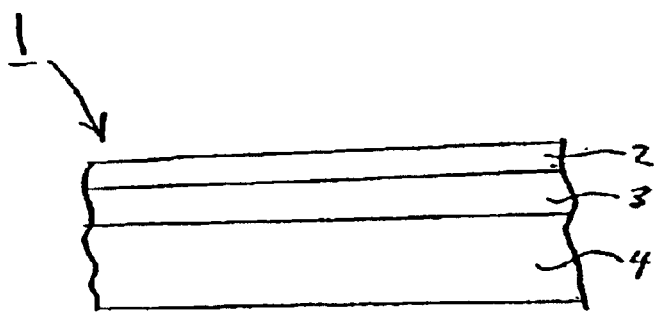
FIGS. 1–4 are schematic, simplified, cross-sectional views illustrating stages in a process for forming a MOS transistor on a strained lattice semiconductor layer according to an embodiment of the present invention.

Referring to FIGS. 1–4, shown therein are schematic, simplified, cross-sectional views illustrating stages in a process for forming a MOS transistor according to an embodiment of the present invention. With particular reference to FIG. 1, a substrate/workpiece 1 comprising a thin, strained lattice semiconductor (or "cap") layer 2 at an upper surface thereof is provided, which thin, strained lattice semiconductor layer 2 is formed on a relatively thicker, underlying crystalline semiconductor buffer layer 3 of different composition, the latter being in overlying contact with a suitable substrate 4. By way of illustration only, the thin, strained lattice semiconductor layer 2 may comprise a tensilely strained, crystalline Si layer from about 25 to about 400 Å thick, preferably from about 50 to about 200 Å thick, epitaxially grown (e.g., by CVD) on a strain-relaxed, graded composition Si—Ge buffer layer 3 from about 100 to about 300 Å thick, which buffer layer 3 is in turn formed on a suitable substrate 4, e.g., a crystalline Si wafer or a silicon-on-insulator (SOI) substrate. As indicated supra, when the Si atoms of the strained lattice semiconductor layer 2 are epitaxially deposited on the Si—Ge buffer layer 3 in alignment with the greater lattice constant (spacing) of the Si and Ge atoms therein, relative to pure Si, the lattice of deposited Si atoms tends to "stretch" to align with the underlying lattice of Si and Ge atoms, thereby "stretching" or tensilely straining Si layer 2. Electron and/or hole mobilities in such Si strained lattice semiconductor layers 2 formed on Si—Ge buffer layers 3 can be as much as about 70% higher than in conventional, relaxed lattice Si, and transistors and IC devices formed therewith can be up to about 35% faster than equivalent devices formed with conventional Si, without any requirement for size reduction.

Figure 2:
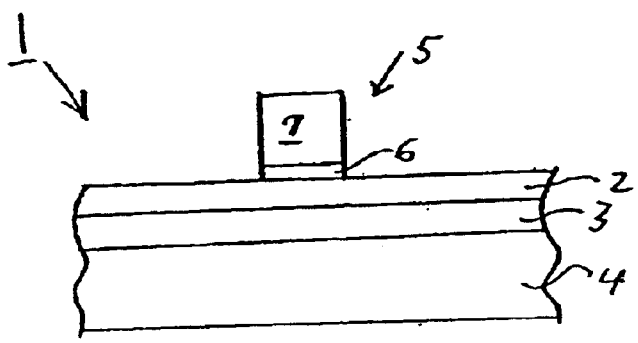

Adverting to FIG. 2, a gate layer stack 5, comprised of a thin gate insulator layer 6, typically a silicon oxide layer less than about 150 Å thick, and a relatively thicker, electrically conductive gate electrode layer 7, typically a doped polysilicon layer, are formed on a portion of the surface of the Si strained lattice semiconductor layer 2, as by conventional processing techniques, e.g., masking and etching, which techniques are not described herein in detail in order not to unnecessarily obscure the present invention.

Figure 3:
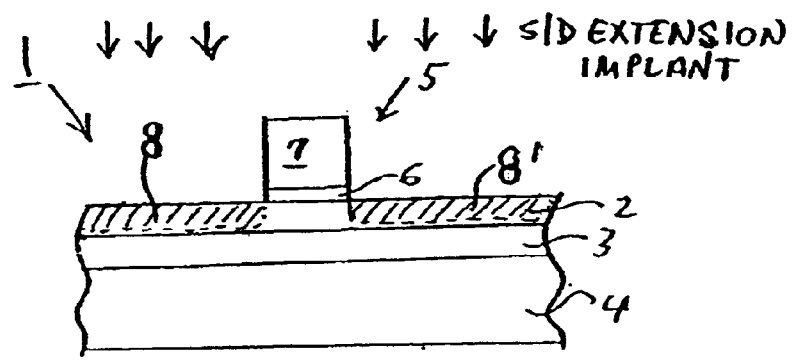

Referring now to FIG. 3, in the next step according to the inventive methodology, the thus-prepared substrate/workpiece 1 with gate layer stack 5 formed thereon is subjected to a dopant implantation process utilizing the gate layer stack 5 as an implantation mask, to selectively form a pair of ultra-shallow depth source/drain extension regions 8, 8' in the exposed regions of the Si strained lattice semiconductor layer 2, which ultra-shallow depth source/drain extension regions 8, 8' extend beneath respective lateral edges of the gate layer stack 5. According to the invention, the dopant implantation energy is selected such that the depth of each of the source/drain extension regions 8, 8' is substantially equal to the thickness of the strained lattice semiconductor layer 2. Thus, each of the source/drain extension regions 8, 8' extends beneath the top surface of layer 2 for substantially the entire thickness thereof, i.e., to a depth at or near the interface of the strained lattice semiconductor layer 2 with the underlying Si—Ge buffer layer 3 (i.e., from about 25 to about 400 Å, typically from about 50 to about 200 Å, below the surface of the Si strained lattice layer 2).

The dopant species for the source/drain extension regions 8, 8' may be n- or p-type, depending upon whether an N-channel or a P-channel MOS transistor is to be formed, and is selected on the basis of having a very low tendency to diffuse from the strained lattice layer 2 into the underlying buffer layer 3. Depending upon the transistor channel type to be formed and the material of buffer layer 3, suitable dopant species may be selected from among Sb, As, B, In, or P-containing ions.

Since, according to the invention, diffusion of the implanted dopant-containing species from the strained lattice (or "cap") semiconductor layer 2 into the underlying buffer layer 3 is effectively prevented, or at least minimized, due to pre-selection of appropriate dopant-containing species and buffer layer material, source/drain extension regions 8, 8' having ultra-shallow junction depths substantially equal to the thickness of the strained semiconductor layer 2 are readily obtained. Moreover, inasmuch as the junction depths of the source/drain extension regions are effectively controlled, i.e., limited, to the thickness of the strained semiconductor layer, implantation dosages may be increased in order to provide lower series resistance, thereby providing benefits of improved $I_{off}$ vs. $I_{on}$, and $V_{ts}$.

By way of illustration, but not limitation, P-channel MOS transistors may be formed according to the invention by utilizing a strained lattice semiconductor substrate/workpiece comprising a Si strained lattice semiconductor layer 2 and a Si—Ge buffer layer 3, by implantation of a boron (B)containing dopant species, e.g., B or $BF_2$ ions, inasmuch as diffusion of such B-containing dopant species Si—Ge layers is very slow. Illustratively, but not limitatively, suitable implantation conditions for forming B-doped P-type source/drain extension regions at ultra-shallow depths from about 25 to about 400 Å, e.g., from about 50 to about 200 Å, in strained lattice Si semiconductor layers 2 of similar thickness, include dosages from about $1\times10^{14}$ to about $1\times10^{15}$ da/cm$^2$ and energies from about 100 eV to about 3 KeV.

Figure 4:
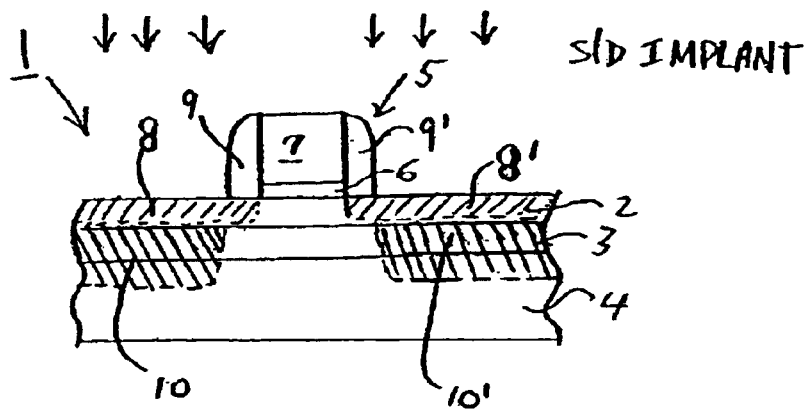

With reference to FIG. 4, according to the next step of the inventive methodology, insulative sidewall spacers 9, 9' are formed on the opposite side edges of the gate layer stack 5, as by conventional blanket insulative layer deposition+anisotropic etching techniques (not described herein in detail for brevity), and the resultant substrate/workpiece 1 then subjected to a second implantation process utilizing the gate layer stack 5 with sidewall spacers 9, 9' thereon as an implantation mask, to selectively form deeper source/drain regions 10, 10' in the portions of the Si—Ge buffer layer 3 and Si semiconductor substrate 4 beneath the exposed regions of the Si strained lattice semiconductor layer 2. By forming the deep source/drain junction regions 10, 10' in Si substrate 4 and not in the smaller bandgap Si—Ge buffer layer 3, low parasitic junction leakage current of the transistor can be maintained. As before, depending upon the transistor type and material of buffer layer 3, suitable dopant species may be selected from among Sb, As, B, In, or P-containing ions.

By way of illustration only, implantation of boron (B)containing dopant ions into the above-mentioned substrate/workpiece 1 comprised of a 25–400 Å thick strained Si layer 2 lattice-matched to a 100–300 Å thick Si—Ge buffer layer 3 on a Si wafer substrate 4 may be performed a dosage from about $1\times10^{15}$ to about $1\times10^{16}$ da/cm$^2$ and an energy from about 400 eV to about 5 KeV to form deeper source/drain regions extending to a depth from about 150 to about 1,000 Å beneath the surface of the substrate/workpiece 1.

The thus-formed substrate/workpiece 1 comprising the ultra-shallow depth, dopant-implanted source/drain extension regions 8, 8' and deeper, dopant-implanted source/drain regions 10, or rapid thermal annealing (RTA) at e.g., 700–1050° C. for 5–30 sec., to activate the dopants therein and effect junction formation.

The present invention thus enables reliable formation of high-quality, high operating speed semiconductor devices based upon strained lattice technology, including MOS transistors and CMOS devices with low series resistance, ultra-shallow depth source/drain extensions providing performance enhancement vis-à-vis conventional devices. In addition, the inventive methodology enjoys utility in the manufacture of numerous other devices requiring enhanced performance characteristics and increased mobility charge carriers. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modification within the scope of the inventive concept as expressed herein.

What is claimed is:

1. A method of manufacturing a semiconductor device, comprising sequential steps of:
   (a) providing a semiconductor substrate including a pre-selected thickness strained lattice layer of a first semiconductor material at an upper surface thereof and an underlying layer of a second semiconductor material; and
   (b) introducing a dopant-containing species of one conductivity type into at least one pre-selected portion of said strained lattice layer of first semiconductor material to form a dopant-containing region therein with a junction at a depth substantially equal to said pre-selected thickness, wherein said second semiconductor material of said underlying layer inhibits diffusion thereinto of said dopant-containing species from said strained lattice layer, thereby controlling/limiting the depth of said junction to substantially said pre-selected thickness of said strained lattice layer.

2. The method as in claim 1, wherein:
   step (a) comprises providing a semiconductor substrate which further comprises a layer of a third semiconductor material beneath said layer of a second semiconductor material.

3. The method as in claim 2, wherein said device comprises at least one MOS transistor; and
   step (a) comprises providing a MOS transistor precursor structure including a semiconductor substrate with at least one gate oxide/gate electrode layer stack on at least one portion of said upper surface of said substrate, said gate oxide/gate electrode layer stack including a pair of opposed side edges; and step (b) comprises introducing said dopant-containing species into exposed portions of said strained lattice layer to form at least one pair of shallow depth source/drain extension regions therein, each of said source/drain extension regions extending from just beneath a respective side edge of said gate oxide/gate electrode layer stack.

4. The method as in claim 3, wherein:
   step (b) comprises introducing said dopant-containing species by ion implantation, with said at least one gate oxide/gate electrode layer stack serving as an implantation mask.

5. The method as in claim 3, wherein:
   step (a) comprises providing a semiconductor substrate wherein said strained lattice layer has a thickness from about 25 to about 400 Å; and
   step (b) comprises forming ultra-shallow source/drain extension regions having a junction depth from about 25 to about 400 Å.

6. The method as in claim 3, wherein:
   step (a) comprises providing a semiconductor substrate wherein said strained lattice layer has a thickness from about 50 to about 200 Å; and
   step (b) comprises forming ultra-shallow source/drain extension regions having a junction depth from about 50 to about 200 Å.

7. The method as in claim 3, further comprising the step of:
   (c) introducing dopant-containing species of said one conductivity type into portions of said shallow-depth source/drain extension regions to form deeper source/drain regions therein each having a junction within said third semiconductor layer.

8. The method as in claim 6, wherein:
   step (c) includes forming sidewall spacers on each of said opposing side edges of said gate oxide/gate electrode layer stack and introducing said dopant-containing species in said portions of said source/drain extension regions by ion implantation, with said gate oxide/gate electrode layer stack with said sidewall spacers thereon serving as an implantation mask.

9. The method as in claim 3, wherein:
   step (a) comprises providing a MOS transistor structure including a substrate wherein said strained lattice semiconductor layer of a first semiconductor material is a crystalline, epitaxial silicon (Si) layer from about 25 to about 400 Å thick, said underlying layer of a second semiconductor material is a crystalline, graded composition silicon-germanium (Si—Ge) layer from about 100 to about 300 Å thick, said crystalline, epitaxial Si layer being formed on said Si—Ge layer, and said layer of a third semiconductor material beneath said Si—Ge layer is a crystalline Si layer of a monocrystalline Si or silicon-on-insulator (SOI) material; and
   step (b) comprises forming at least one pair of shallow depth source/drain extension regions having a junction depth from about 25 to about 400 Å.

10. The method as in claim 9, wherein:
    step (a) comprises providing a MOS transistor structure including a substrate wherein said strained lattice semiconductor layer of a first semiconductor material is a crystalline, epitaxial silicon (Si) layer from about 50 to about 200 Å thick; and
    step (b) comprises forming at least one pair of shallow depth source/drain extension regions having a junction depth from about 50 to about 200 Å.

11. The method as in claim 9, wherein:

step (b) comprises implanting boron (B)-containing p-type dopant species at a dosage from about $1\times10^{14}$ to about $1\times10^{15}$ da/cm$^2$ and an energy from about 100 eV to about 3 KeV, said at least one gate oxide/gate electrode layer stack serving as an implantation mask.

12. The method as in claim 11, further comprising the step of:

(c) forming sidewall spacers on each of said opposing side edges of said at least one gate oxide/gate electrode layer stack and implanting said boron (B)-containing p-type dopant species in exposed portions of said shallow-depth source/drain extension regions at a dosage from about $1\times10^{15}$ to about $1\times10^{16}$ da/cm$^2$ and an energy from about 400 eV to about 5 KeV to form deeper source/drain regions each having a junction within said layer of third semiconductor material, said at least one gate oxide/gate electrode layer stack with said sidewall spacers thereon serving as an implantation mask.

13. A method of manufacturing a MOS transistor device, comprising steps of:

(a) providing a semiconductor substrate including a pre-selected thickness strained lattice layer of a first semiconductor material at an upper surface thereof, an underlying layer of a second semiconductor material, and a layer of a third semiconductor material beneath said layer of a second semiconductor material;

(b) forming at least one gate oxide/gate electrode layer stack on at least one portion of said upper surface of said substrate, said gate oxide/gate electrode layer stack including a pair of opposed side edges;

(c) introducing a dopant-containing species into exposed portions of said strained lattice layer to form at least one pair of ultra-shallow depth source/drain regions therein, each of said source/drain extension regions extending from just beneath a respective side edge of said at least one gate oxide/gate electrode layer stack and having a junction at a pre-selected depth substantially equal to said pre-selected thickness of said strained lattice layer, wherein said second semiconductor material of said underlying layer inhibits diffusion thereinto of said dopant-containing species from said strained lattice layer, thereby controlling/limiting the depth of said junction to substantially said pre-selected thickness of said strained lattice layer; and (d) introducing said dopant-containing species in exposed portions of said shallow-depth source/drain extension regions to form deeper source/drain regions each having a junction within said layer of third semiconductor material.

14. The method as in claim 13, wherein:

step (a) comprises providing a substrate wherein said strained lattice semiconductor layer of a first semiconductor material is a crystalline, epitaxial silicon (Si) layer of pre-selected thickness from about 25 to about 400 Å, said underlying layer of a second semiconductor material is a crystalline, graded composition silicon-germanium (Si—Ge) layer from about 100 to about 300 Å thick, said crystalline, epitaxial Si layer being formed on said Si—Ge layer, and said layer of a third semiconductor material beneath said Si—Ge layer is a crystalline. Si layer of a monocrystalline Si or silicon-on-insulator (SOI) material;

step (c) comprises forming ultra-shallow source/drain extension regions having a junction depth from about 25 to about 400 Å; and step (d) comprises forming deeper source/drain regions having a junction depth from about 150 to about 1,000 Å.

15. The method as in claim 14, wherein:

step (c) comprises forming ultra-shallow source/drain extension regions having a junction depth from about 50 to about 200 Å; and step (d) comprises forming deeper source/drain regions having a junction depth from about 200 to about 1,000 Å.

16. The method as in claim 14, wherein:

step (c) comprises implanting boron (B)-containing p-type dopant species at a dosage from about $1\times10^{14}$ to about $1\times10^{15}$ da/cm$^2$ and an energy from about 100 eV to about 3 KeV, said at least one gate oxide/gate electrode layer stack serving as an implantation mask; and step (d) comprises forming sidewall spacers on each of said opposing side edges of said gate oxide/gate electrode layer stack and implanting said boron (B)containing p-type dopant species in exposed portions of said shallow-depth source/drain extension regions at a dosage from about $1\times10^{15}$ to about $1\times10^{16}$ da/cm$^2$ and an energy from about 400 eV to about 5 KeV to form deeper source/drain regions each having a junction within said layer of third semiconductor material, said at least one gate oxide/gate electrode layer stack with said sidewall spacers thereon serving as an implantation mask.

* * * * *